United States Patent
Outwater et al.

(10) Patent No.: US 11,713,519 B1
(45) Date of Patent: Aug. 1, 2023

(54) INTEGRATED CRUCIBLE AND DIE SYSTEM FOR SAPPHIRE SHEET GROWING

(71) Applicant: Sapphire Systems, Inc., Bedford, MA (US)

(72) Inventors: John Outwater, Bedford, MA (US); Bradford Shattuck Collins, Bedford, MA (US)

(73) Assignee: Sapphire Systems, Inc., Bedford, MA (US)

( * ) Notice: Subject to any disclaimer, the term of this patent is extended or adjusted under 35 U.S.C. 154(b) by 40 days.

(21) Appl. No.: 17/667,505

(22) Filed: Feb. 8, 2022

Related U.S. Application Data

(60) Provisional application No. 63/146,738, filed on Feb. 8, 2021.

(51) Int. Cl.
*C30B 15/24* (2006.01)
*C30B 35/00* (2006.01)
*C30B 19/08* (2006.01)
*C30B 29/20* (2006.01)

(52) U.S. Cl.
CPC ............ *C30B 35/002* (2013.01); *C30B 15/24* (2013.01); *C30B 19/08* (2013.01); *C30B 29/20* (2013.01)

(58) Field of Classification Search
CPC ....... C30B 35/002; C30B 19/08; C30B 29/20; C30B 15/24
See application file for complete search history.

(56) References Cited

U.S. PATENT DOCUMENTS

| | | | | |
|---|---|---|---|---|
| 4,000,030 | A * | 12/1976 | Ciszek ................... | C30B 15/10 117/936 |
| 4,075,055 | A * | 2/1978 | Ciszek ................... | C30B 15/24 117/34 |
| 4,121,965 | A * | 10/1978 | Leipold .................. | C30B 15/34 136/258 |
| 4,299,648 | A * | 11/1981 | Ciszek ................... | C30B 15/24 117/936 |
| 9,551,089 | B2 * | 1/2017 | Ouellette ............... | C30B 29/20 |
| 2014/0102358 | A1 * | 4/2014 | Buzniak ................. | C30B 15/34 117/211 |

* cited by examiner

*Primary Examiner* — Robert M Kunemund
(74) *Attorney, Agent, or Firm* — Ascentage Law, PLLC

(57) ABSTRACT

An integrated die and crucible system used an integrated die and crucible assembly that allows for improved sapphire sheet growing as result of targeted heat features and controls of the integrated die and crucible system and corresponding systems used to form the integrated die and crucible assembly, which include in part heat plugs, as well specific wall thicknesses about the die and crucibles.

19 Claims, 23 Drawing Sheets

VARIABLE INSULATION PLUG

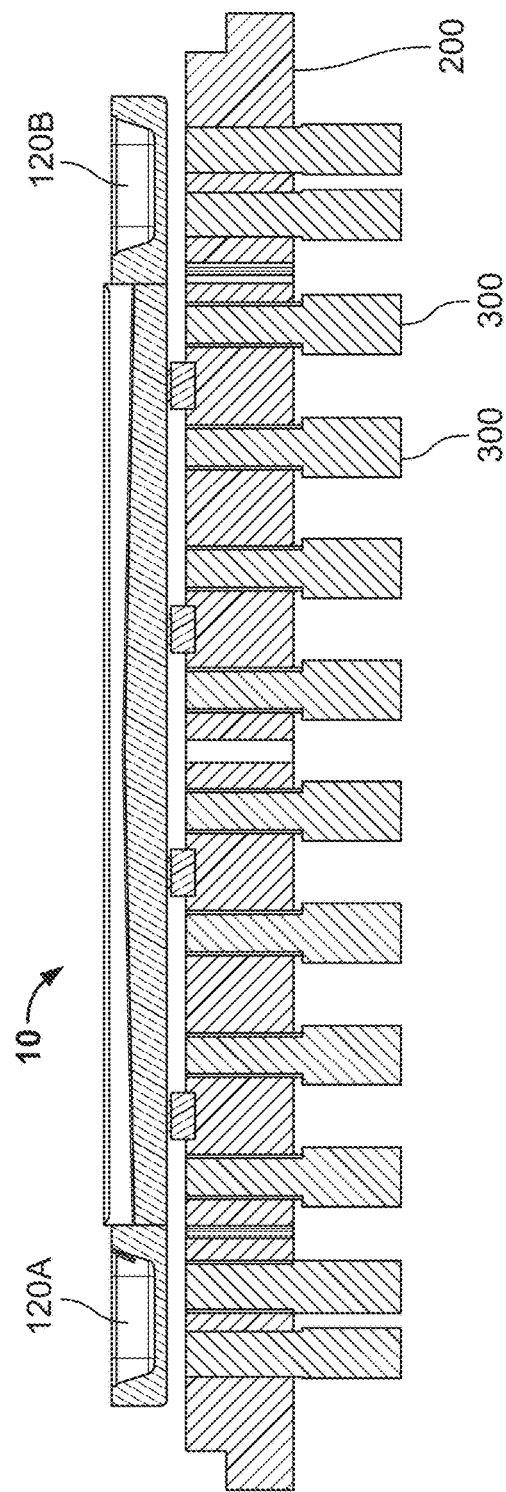
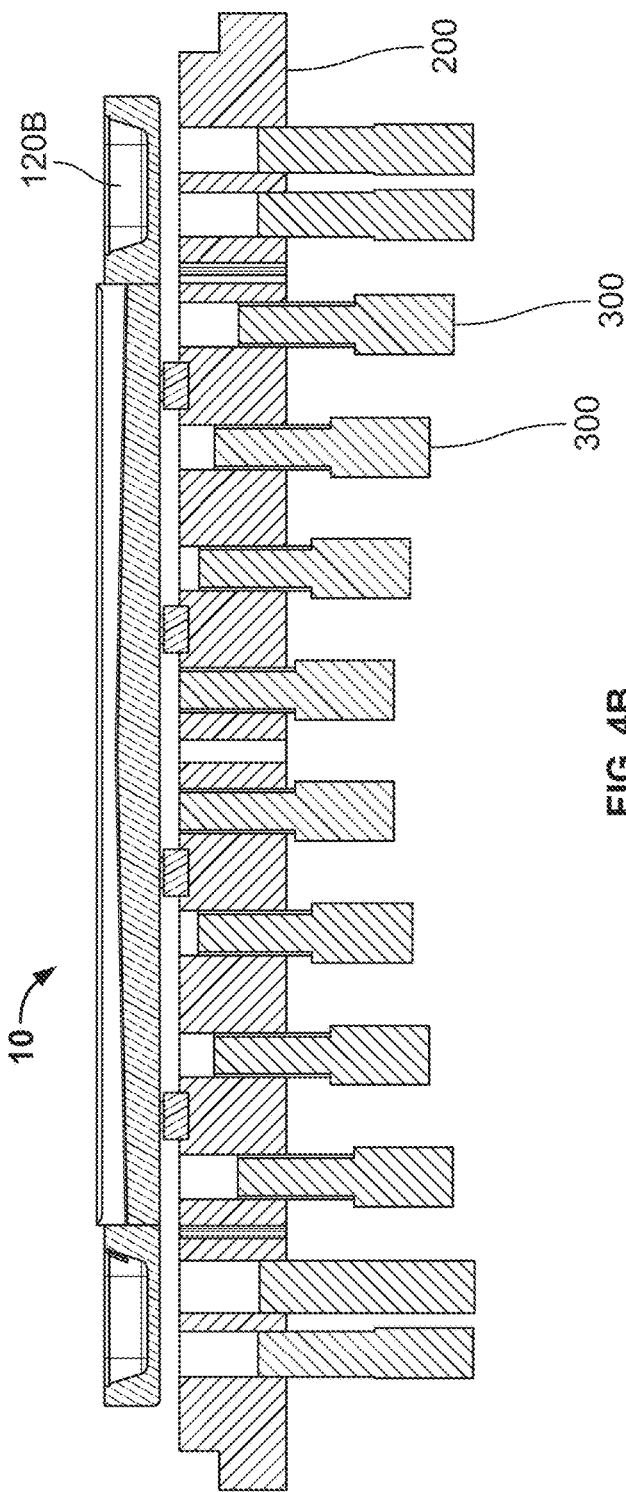
FIG. 4A
FIG. 4B

600

600

700

700

700

900

900

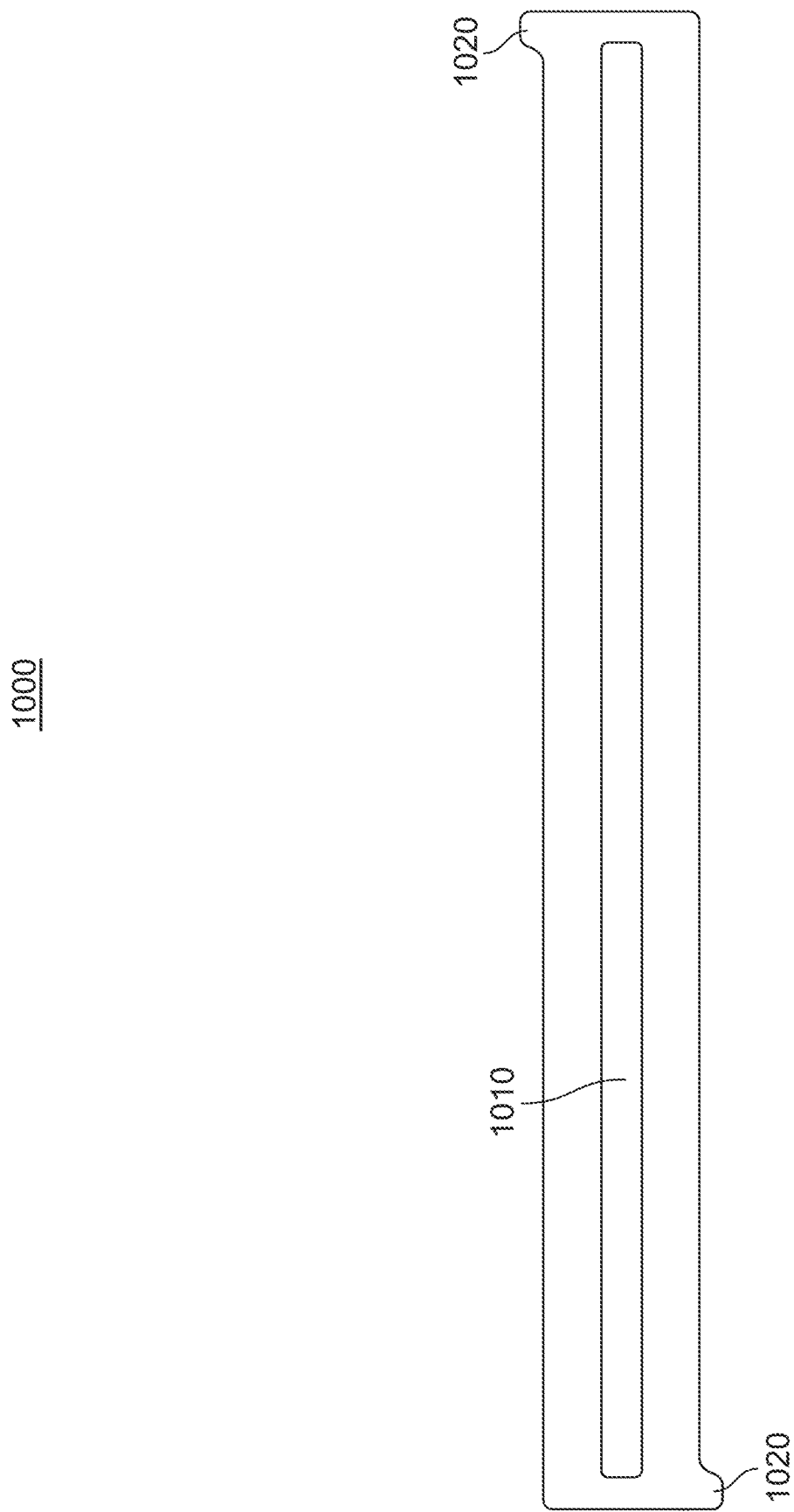

INTEGRATED CRUCIBLE AND DIE SYSTEM FOR SAPPHIRE SHEET GROWING

CROSS-REFERENCED TO RELATED APPLICATIONS

This application claims the benefit of U.S. Provisional Patent Application No. 63/146,738 filed on Feb. 8, 2021; which is herein incorporated by reference in entirety.

FIELD OF THE INVENTION

The present invention generally relates to the growing of single crystal-sapphire sheet.

BACKGROUND OF THE INVENTION

Current technology for growing single-crystal sapphire sheets includes placing a die in a large bath of melted sapphire where the bath of 'melt' is within a larger crucible. A heating device around the crucible keeps the sapphire melted and the die hot. The melt directly surrounds the die used to define the growing sheet of sapphire. To initiate growth, an oriented, single-crystal sapphire "seed" is lowered to make contact with the liquid film on the die at its center, then drawn upward.

One of the drawbacks of this process is the difficulty of controlling the temperature of the die along its length. This difficulty arises from the fixed, indirect method of heating the die. It also arises from the insulating property of the liquid melt around the die, contained in the large crucible. At different times during the growth process, it is highly advantageous to have different temperature profiles along the length of the die.

The present application solves this and other problems, which enables wider sheets of sapphire to be grown in a more efficient manner. It also greatly reduces the size of the system, and hence its cost, relative to the size of the sheet grown.

SUMMARY OF THE INVENTION

In one embodiment a system for creating a single-crystal sapphire sheet, comprises a body portion having a channel and crystal shaper formed therein. On one or both ends are integrated crucibles each with a cavity and opening in fluid communication with the channel of the body portion.

In a variation of the above embodiment, the integrated crucible and die system includes forming a peak in the center portion of the channel. This can be where the initial single-crystal sapphire can be dipped and begin the drawing out process.

In the embodiment the integrated crucible and die system can be formed of tungsten or molybdenum.

In the embodiment of the crucible and die system the crucible on end one is offset to the channel, and the crucible on the second is also offset as well. The offsets of crucible one and two mirror each other about the axis to the channel.

The wall thickness of the integrated crucible and die system has a thickness from an outer edge of each of a cavity portion of the first and second crucibles has a dimension that is less than a wall thickness from either edge of the channel to an outer surface of the body portion.

The integrated crucible and die system is further comprised of a heater disposed about the perimeter of the integrated system, and where in the interior of the heater corresponds in shape to the perimeter of the integrated system.

The heater has a first and second end position, with a central portion disposed therebetween, and wherein the central portion is configured to produce heat output that is greater than either end portions.

The heater also has a first and second end position, with a central portion disposed therebetween, and wherein the central portion has a wall thickness that is less than a wall thickness about either end portions.

The integrated crucible and die system can also comprise: a first cover having an opening that is disposed over a cavity portion of the first crucible; a second cover also having an opening that is disposed over a cavity portion of the second crucible; a first angled feed tube having a first aperture and second aperture, wherein the second aperture is lager that the first aperture, the second aperture is shaped and sized to fit over the opening of the first cover; and a second angled feed tube having a first aperture and a second aperture, wherein the second aperture is larger than the first aperture, the second aperture is shaped and sized to over the opening of the second cover.

The first and second angled feed tube of the integrated crucible and die system incorporate wherein each angled tube has a scatter pin disposed across an interior cavity portion of each of the angled feed tubes and is configured to cause material entering the first aperture of each to scatter about prior to leaving the second aperture into respective crucibles.

A system for creating a single-crystal sapphire sheet comprises an integrated crucible and die comprising; a body portion having a channel across the length of the body portion and a crystal shaper disposed about a portion of the channel and extending from the body portion a first crucible disposed on a first end of the body portion, wherein the channel extends into the first crucible, and a second crucible disposed on a second end of the body portion, wherein the channel extends into the second crucible, wherein the first crucible, the second crucible and the body portion form an integrated system, and wherein each crucible is in fluid communication with the channel and crystal shaper; and a heater having an interior cavity disposed about the integrated crucible and die, wherein the interior cavity has a shape that corresponds in shape to the perimeter of the integrated crucible and die.

There is also a uniform gap that exists between the interior cavity of the heater and perimeter of the integrated crucible and die. Furthermore, a first cover having an opening that is disposed over a cavity portion of the first crucible, and a second cover having an opening that is disposed over a cavity portion of the second crucible. A first angled feeding tube having a first aperture and a second aperture, wherein the second aperture is larger than the first aperture, the second aperture is shaped and sized to fit over the opening of the first cover, and a second angled feed tube having a first aperture and a second aperture, wherein the second aperture is larger than the first aperture, the second aperture is shaped and sized to fit over the opening of the second cover.

In yet another embodiment a method for producing a single-crystal sapphire comprises the following steps of: 1) feeding Alumina pellets through the first and second angled feeding tubes to a first and second crucible, wherein the first crucible and second crucible have an integrated die disposed between each crucible, and where in the integrated die includes a channel that is in fluid communication with both crucibles; 2) melting the Alumina pellets at a first heat output using a heater disposed about the first crucible, second crucible and integrated die; feeding melted Alumina from each crucible into the integrated die through the channel; 3) heating the integrated die with a second heat output using the heater disposed about the first and second crucible and integrated die; 4) depositing a seed for A or C-plane growth into a center portion of the integrated die; and 5) drawing out of the seed using a seed holder while continuing to melt Alumina into each crucible and feeding the melted Alumina into the channel of the integrated die where it can begin to form a single-crystal sapphire.

An additional step to the above method can include scattering the Alumina entering the first and second angled feeding tubes using a scatter pin disposed across the length of tan interior cavity of each of the angled feeding tubes, such that Alumina pellets deposit into the first and the second crucible at varying locations, whereby a more uniform melting process can occur.

In the above method, the first heat output can be less than the second heat output. The first heat output can be generated by a portion of the heater having a wall thickness that is greater than a portion of wall thickness of the heater that generates the second heat output.

The present invention is not limited to the above features and advantages. Those of ordinary skill in the art will recognize additional features and advantages upon reading the following detailed description and viewing the accompanying drawings.

BRIEF DESCRIPTION OF THE DRAWINGS

FIGS. 2A-C are illustrations of a base insulation module which the system of FIGS. 1A-G can be disposed on;

FIGS. 4A-B illustrate various positions of a plurality of heat plugs being used with the base insulation module and the die and crucible system.

FIG. 10 illustrates a view of the shield that covers the crucible/die;

DETAILED DESCRIPTION OF THE INVENTION

Figure 1A:
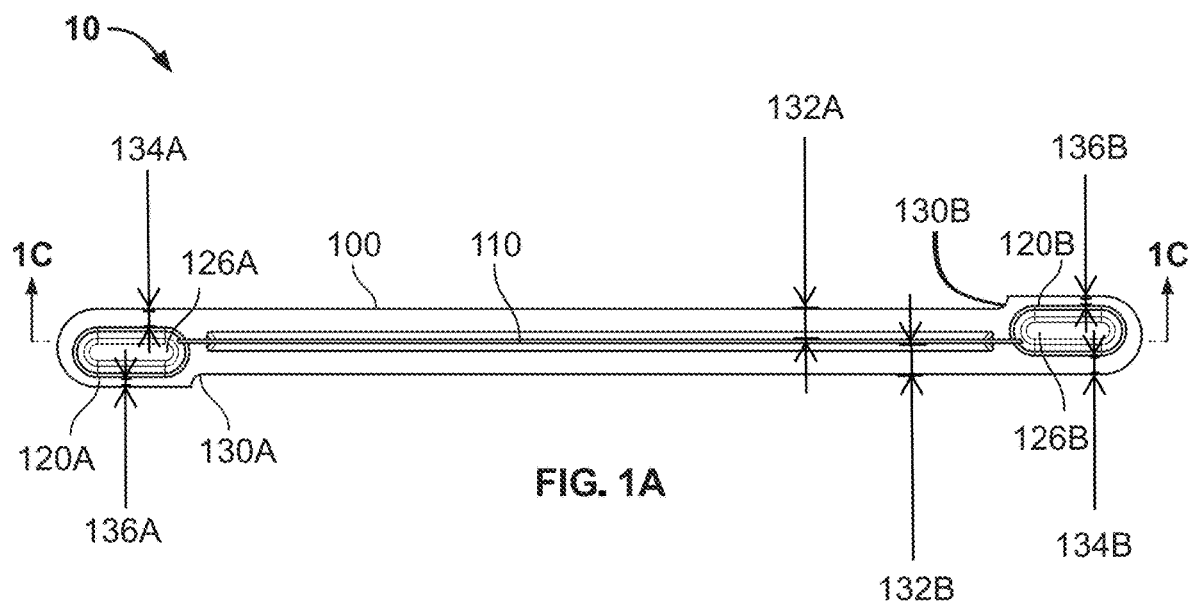
FIGS. 1A-G are illustrations of various views of an integrated die and crucible system for use in creating single crystal sapphire sheets.

FIGS. 1A-G are illustrations of various views of an integrated die and crucible system 10 for use in creating single-crystal sapphire sheets. FIG. 1A shows a top view of the integrated die and crucible system 10 having a body portion 100 that has two crucibles 120A, 120B. Each of the crucibles 120A, B are integrated on opposite ends of the body portion 100. A channel 110 runs from one crucible 120 through the body portion 100 to the opposite crucible 120. Protrusions or extensions 130A, 130B are located along the body portion of 100 on opposite sides and ends of each other. These extension portions 130A, B form part of the integrated crucibles 120A, B. Each crucible has a corresponding cavity 126A and 126B. The cavities are offset from each other with respect to the channel 110. The wall thickness 132A and 132B of the outer edge of the body portion to the channel 110 has a thickness that is greater than the wall thickness of portions 134A, 134B, 136A and 136B. This is intentional for several reasons, but one of the primary reasons is for heat control. The curvature and overall shape of the body portion section 100 of 10 and the crucible sections correspond in shape to the heater 500 discussed further below. For example, extensions 130A, B corresponds to notch 530 of heater 500, which is where the wall thickness transitions from 514A, 514B, 516A, or 516B to 512.

As noted, the difference in wall thickness has an impact on heating system 10. Wall thickness for the heater 500 also has an impact on the amount of heat emanating from the heating at a given section. The thicker wall sections around body portion 100 generate less heat, while the thickness around the cavities of the crucibles is thinner and generates more heat. Controlling heat is important to generating consistent sapphire sheets. More heat is required in the die portion, where the sapphires sheets are being formed from, because this is where a substantial amount of heat loss is occurring, as the sheet is being pulled upward and away from the die portion of the system 10, heat is also moving upward and being drawn away. Thus, there is a need to design a system that adequately transfers sufficient heat to melt the alumina, while maintaining the heat around the formation of the sapphire sheet, which has a different heating requirement. One advantage of this type of system is that it reduces the overall power input from traditional methods that require over 100 kilowatts of power to one that uses 25-30 kilowatts of power.

Figure 1B:
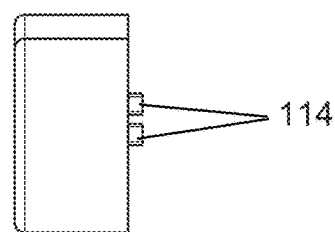

FIG. 1B illustrates an end view of system 10. 114 is the crystal shaper and is part of the die.

Figure 1C:
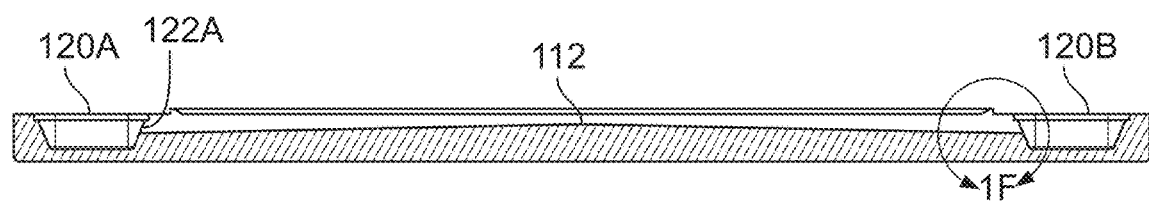
Figure 1D:
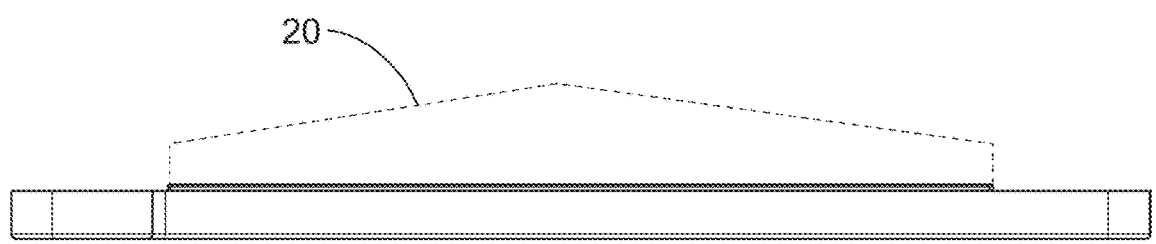

Referring to FIG. 1C, which is cross-sectional side view of FIG. 1A, the channel 110 has a peak 112 disposed approximately in the middle of the channel 110 and is sloped on either side into the crucibles 120. Each crucible has an opening 122 allowing fluid communication between the crucibles 120A, B and the channel 110. The melted alumina transfers from the crucibles into the channel, which can be drawn out using a seed crystal. The FIG. 1D, is illustrative of drawing out a single-crystal sapphire sheet from system 10. The shape of the single-crystal sapphire sheet is formed by the crystal shaper 114, which extends upwards from the body 100. The crystal shaper 114 has two ends 116A and 116B, which help define the width of the sheet. This particular crystal shaper has a valley in a V-shape that leads from the edges into the channel 110. The crystal shaper could also have a flat top in other embodiments. Those skilled in the art have used both styles.

Figure 1E:
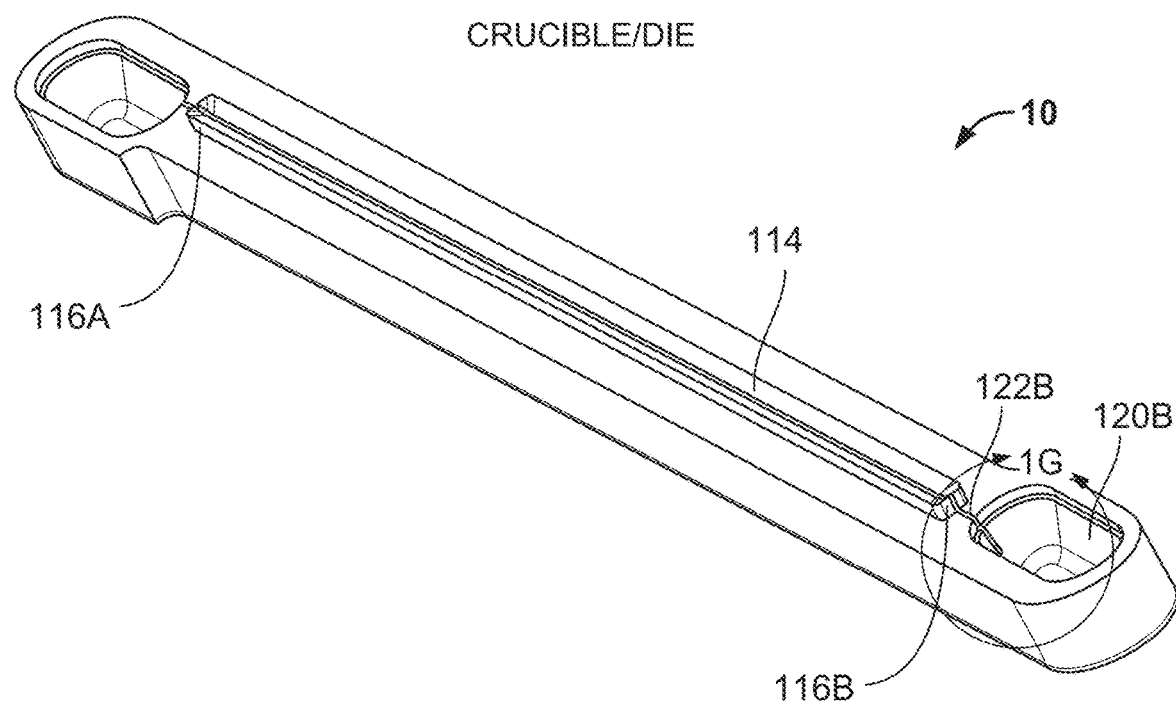
Figure 1F:
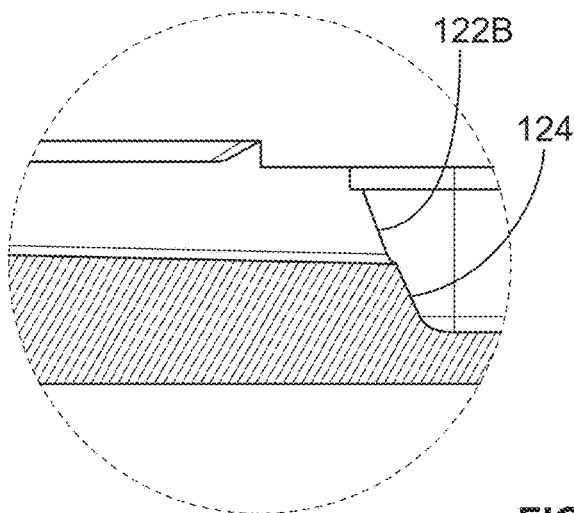
Figure 1G:
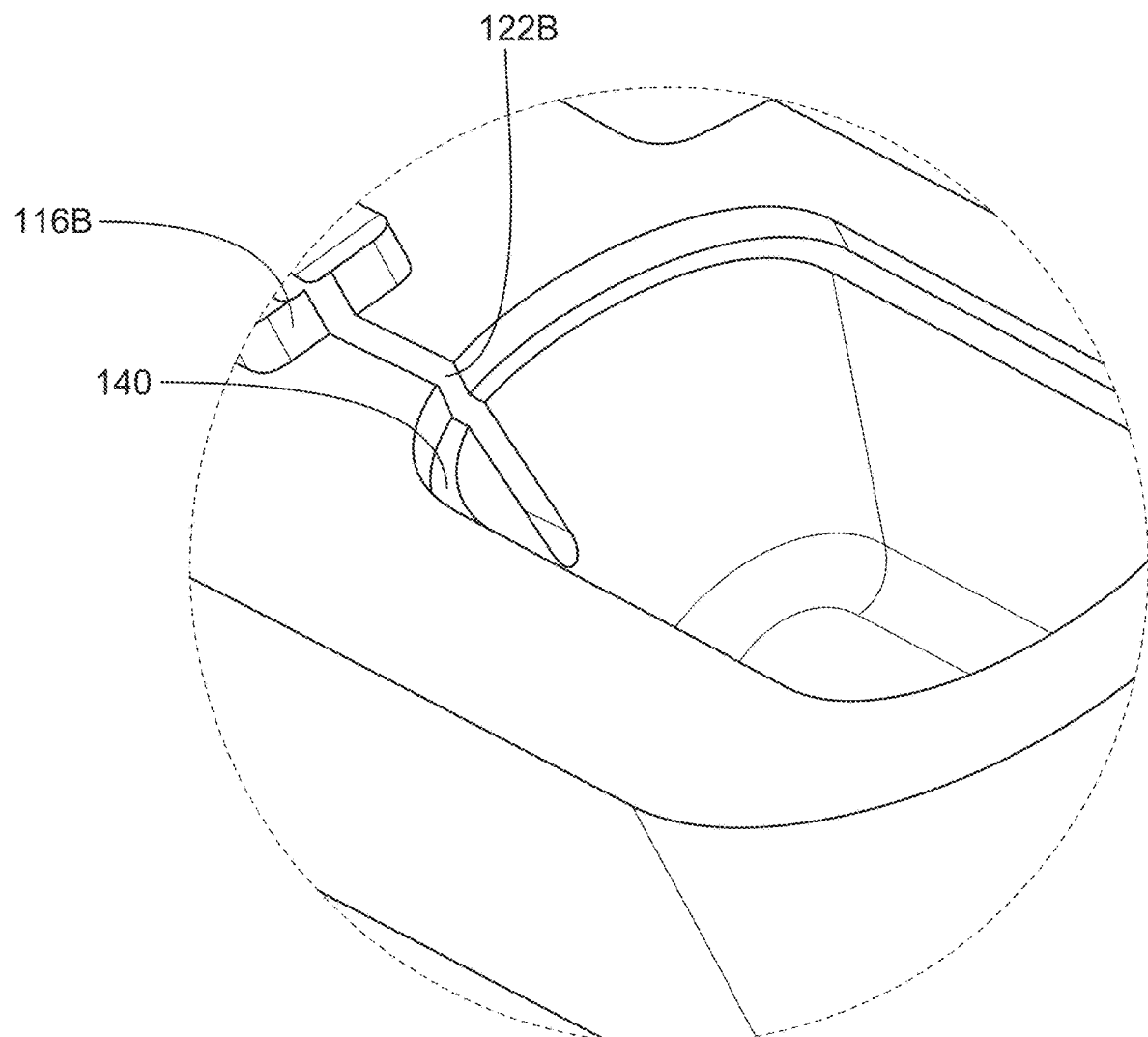

FIG. 1E is a perspective view of system 10. FIG. 1F is a detail cross-sectional view of one of the crucibles 120B and further illustrates a sloped sidewall 124 of the crucible 120. FIG. 1G is detail perspective view showing the opening 122A from crucible 120A into the channel 110. It also shows ledge or lip 140 where a cover can be placed over the cavity portion of each crucible and discussed further below.

Applicant refers to U.S. application Ser. No. 10/820,468 filed Apr. 8, 2004 as a prior art reference where a die (18) is disposed within a large crucible (20). A heating system or element (17) is disposed around the outside of the crucible, which causes a feed material, such as $Al_2O_3$, to melt within the crucible.

One of the advantages of the present application is that the system 10 integrates two crucibles on either end of a die, as discussed above. Alumina ($Al_2O_3$) can be melted on both sides of the system 10 using an external heating source 500, but known in the art, such as induction heating using a graphite heater. As a result of system 10 being an integrated, it is easier to create a consistent heat profile along the body 100 of the system 10, which consistent profile allows for a wider sheet of single crystal sapphire sheet to be produced. The cost of producing the unitary die/crucible is also substantially lower than the cost of producing a separate die and large crucible. It is also more compact, substantially reducing the cost of all auxiliary components, such as heating (as noted above), insulation, cooling, and containment. For example, a sheet having a width of over 12 inches, over 14 inches, over 16 inches and even over 18 inches is possible with consistency. Some sheets have been grown as wide as 16 inches wide using a conventional die in a conventional crucible containing a liquid bath, but not with consistency on a scale for mass production, in part because of the lack of control regarding directing and controlling the immense amount of heat that is input into the process. In the present system 10, both sides can be heated to similar temperatures and be consistently fed $Al_2O_3$ that turns into a melt that is drawn into the channel 110. The peak 112 of the channel helps create this uniform heat profile and is generally the starting point for adding the single crystal sapphire seed to attract the melt and begin drawing the sheet off of the die 110.

In one embodiment, the material of system 10 is formed of molybdenum, while in another tungsten is used.

Figure 2A:
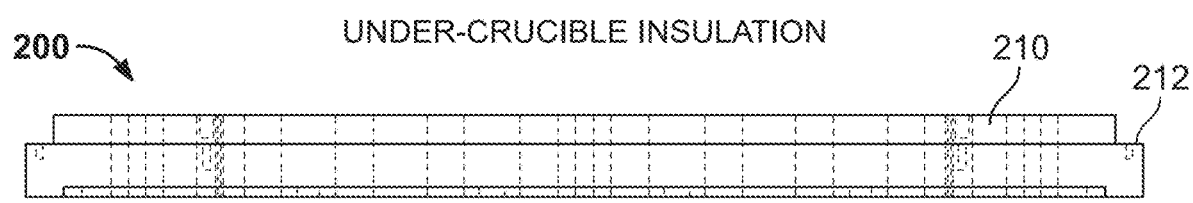
Figure 2B:
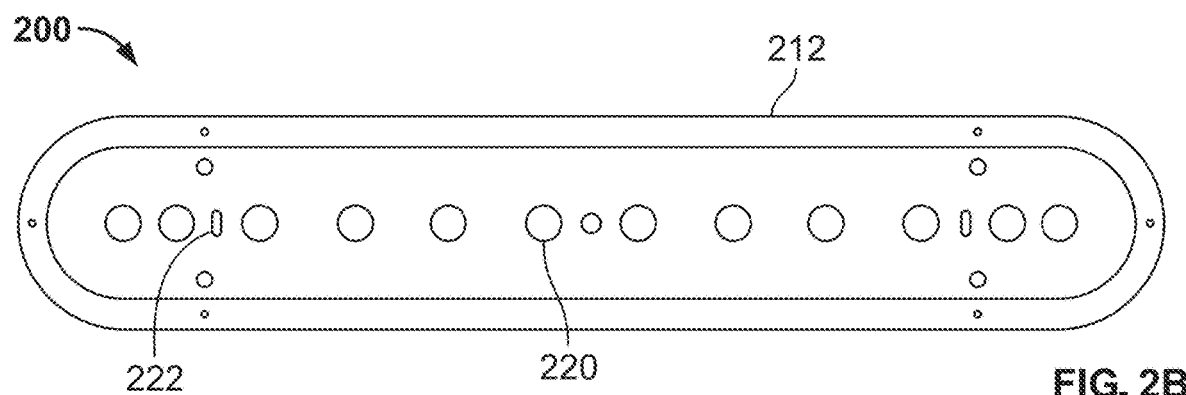
Figure 2C:
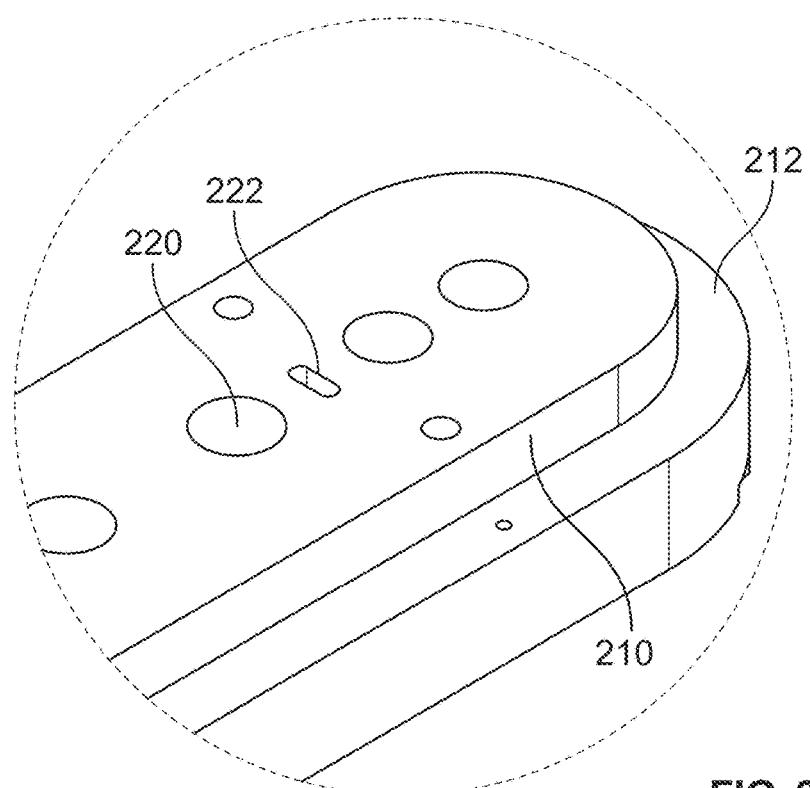

FIGS. 2A-C illustrate a base insulation module 200, comprising a base section 210, and a perimeter section 212 that forms a ledge and is wider than and longer than the base section 210. plurality of thermal venting apertures 220 and 222. Alignment holes are also shown, but not labeled to correspond to the protrusions from the integrated die and crucible system 10. The apertures can be utilized to provide a controlled heat profile along the length of the system 10.

Figure 3A:
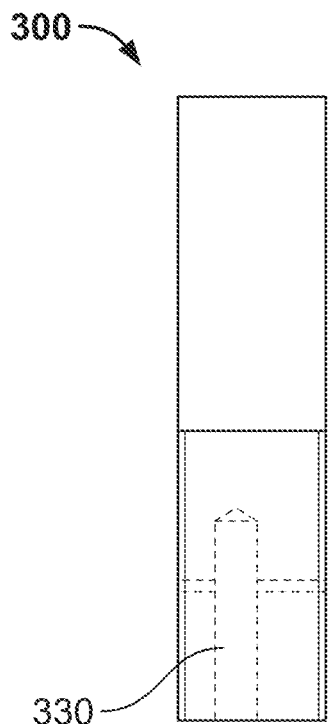
FIGS. 3A-C are various views of removable heat plugs.
Figure 3B:
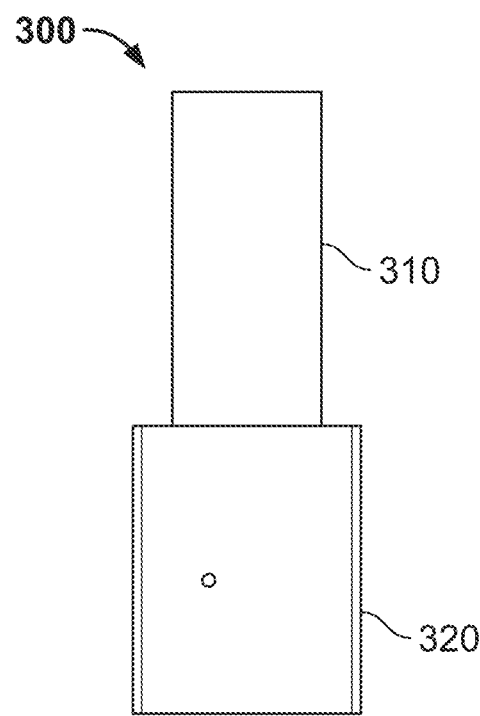
Figure 3C:
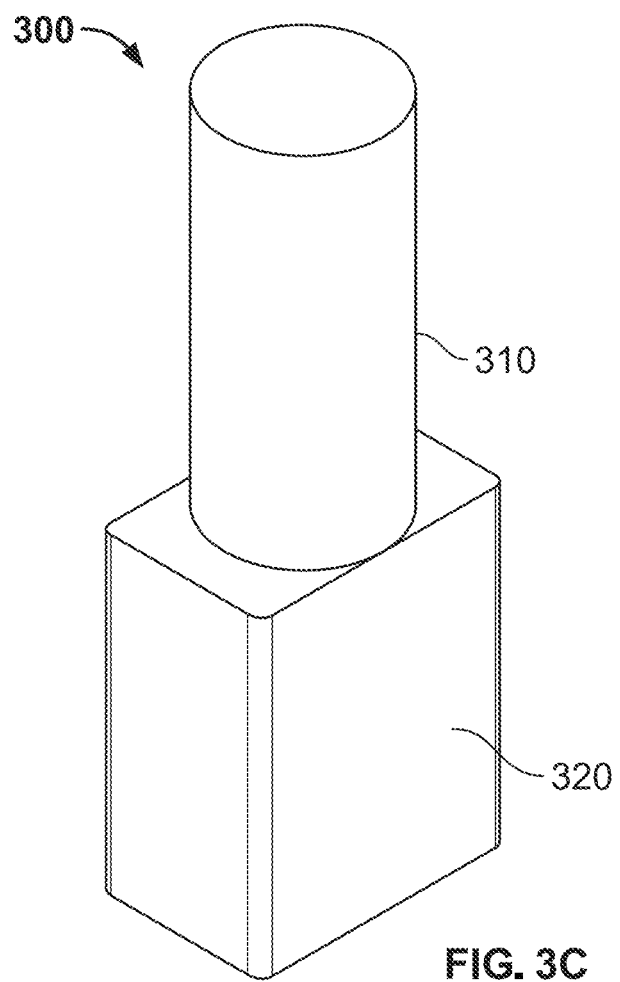

FIGS. 3A-C illustrate heat plugs configured to be inserted into the various venting apertures of base insulation module 200. A schematic showing the internal features including a threaded channel 330 is shown in FIG. 3A. FIG. 3B shows a front view of the heat plug 300 having an arm or extension portion 310 configured to match the profile of the venting apertures of 220 and 222. A base 320 provides support to the arm or extension portion and for the channel 330. A screw or other attaching mechanism can be inserted into the channel 330 and used to raise or lower each of the heat plugs 300 into the base insulation module 200.

A sideview cross-sectional view is shown in FIGS. 4A-B, that convey the relationship of the system 10 on top of 200, with heat plugs 300 in various positions. For example, in FIG. 4A all of the heat plugs 300 are inserted into bottom insulation 200 at a uniform height, while in FIG. 4B the position of the heat plugs 300 varies. The crucibles 120 on either end of the assembly 10 may initially require less heat as they begin melting $Al_2O_3$ pellets, which melt is then being drawn into channel 110. Once the melting becomes consistent, the crucibles may not need more heat as the rate of drawn melt increases, thus heat plugs can be pushed in and pulled out on the crucibles ends to control the heat entering each crucible.

It is essential to be able to vary the heat imparted to the crucibles independently of the heat imparted to the die. If the heater imparts too much heat to the crucibles, the liquid may overheat and degrade. At seeding, for example, when the crystal is narrow and the mass growth rate (and hence demand for liquid sapphire) is small, less melting heat will be required than when the crystal is full width and its mass growth rate is high. Thus, as shown in FIG. 4B, the heat plugs can be pulled further out at the ends (under the crucibles) during seeding, to vent excess heat and prevent overheating of the liquid during that phase of growth. Thermal venting allows the amount of heat imparted to different regions of the crucible to be varied, which is otherwise impossible with the fixed heater. This kind of venting system works effectively with the integrated die and crucible system 10, as well as other configurations.

Figure 5A:
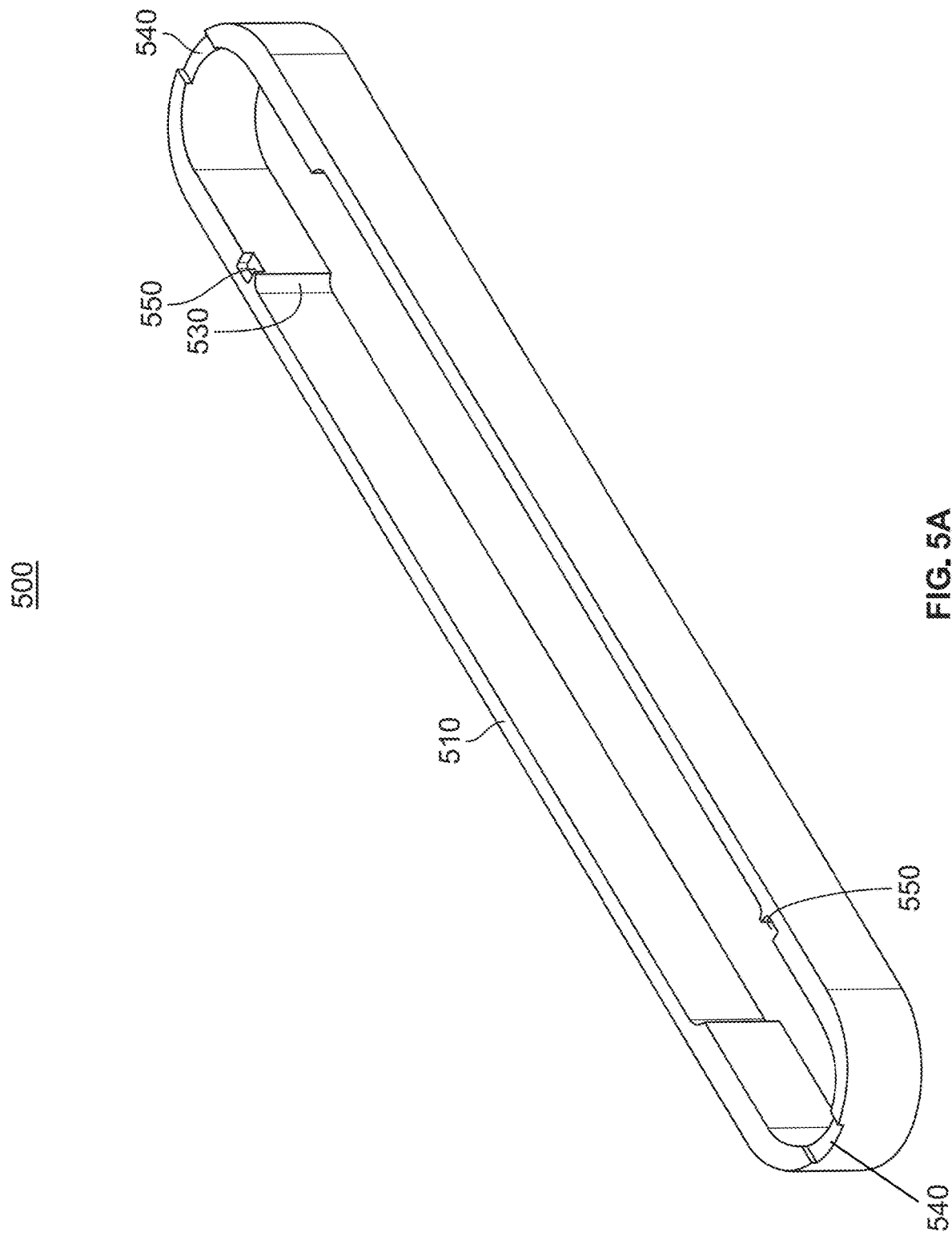
FIGS. 5A-D illustrate various views of the crucible/die heater that surrounds the integrated die and crucible system.

The heat source for this system is portrayed by FIGS. 5A-D. FIG. 5A is a rendering of a heating element that surrounds the system 10, and is designed to be small and compact, and nestle the crucible/die within the heating walls 510. Though the walls of 500 correspond in shape, there is meant to be a gap between the heater 500 and the integrated system 10. This gap 1130 is shown in FIG. 11B.

There are a variety of notches within the heating wall 510. Notch 550 is designed receive the protrusion of 1020 of the heat shield. Notch 530 is designed to transition the thickness in wall thickness as noted above to change the heating profile and rate between the die section and crucible sections of system 10.

Another advantage of this system is that if the system needs to be replaced, you can swap it out quickly, and eliminate down time. Similarly, most of the systems and components, namely 10, 200, 300, 500, 600, and 700 are meant to be easily replaced.

A notch 540 is formed on each side of 500. These notches open up a view path to the die. For viewing, a hole can be cut or formed into the sidewall insulation 1110 heater insulation outside and above this notch. When not viewing or inspecting the sheet growth a small piece of rigid graphite insulation can be inserted into notch 540 to reduce heat loss out the view hole.

Figure 5B:
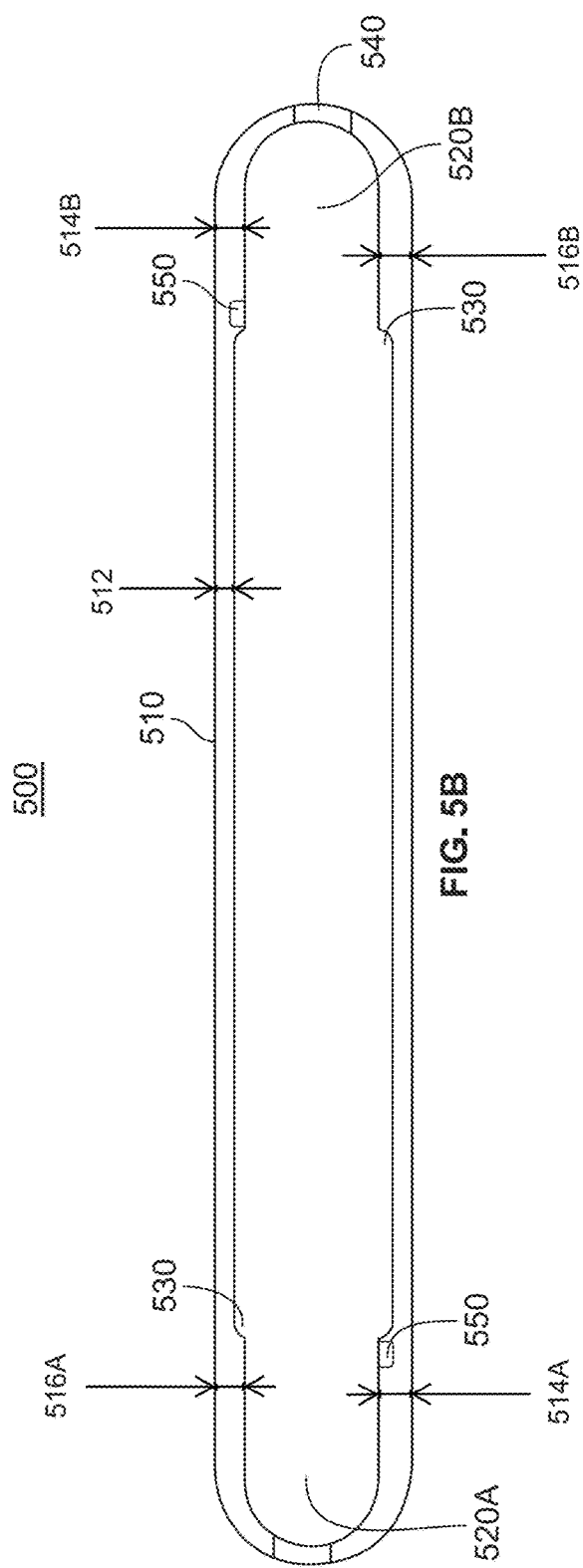
Figure 5C:
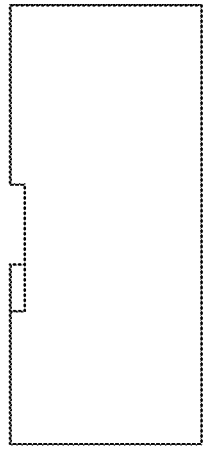
Figure 5D:
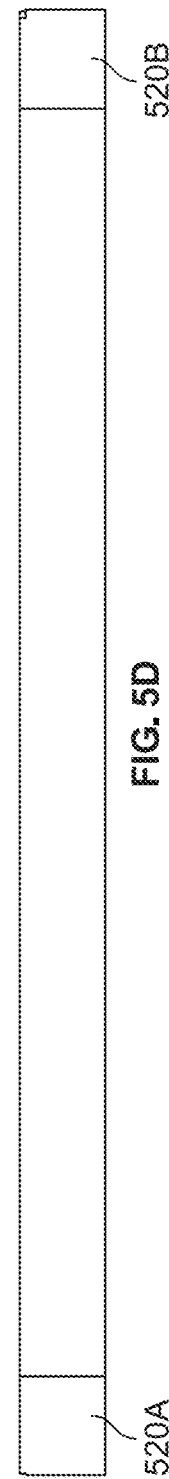

FIG. 5B is a top-down view of the heating element showing the receiving notches of 530 and 550. As noted above, the various wall thicknesses 512, 514A, 514B, 516A, and 516B are shown and noted to have an impact on the heater and heating the system. FIG. 5C is an end view of the heating element. FIG. 5D is side view of the heating element showing where notch 530 is located and showing 520A-B ends where the heating crucibles are located.

Figure 6A:
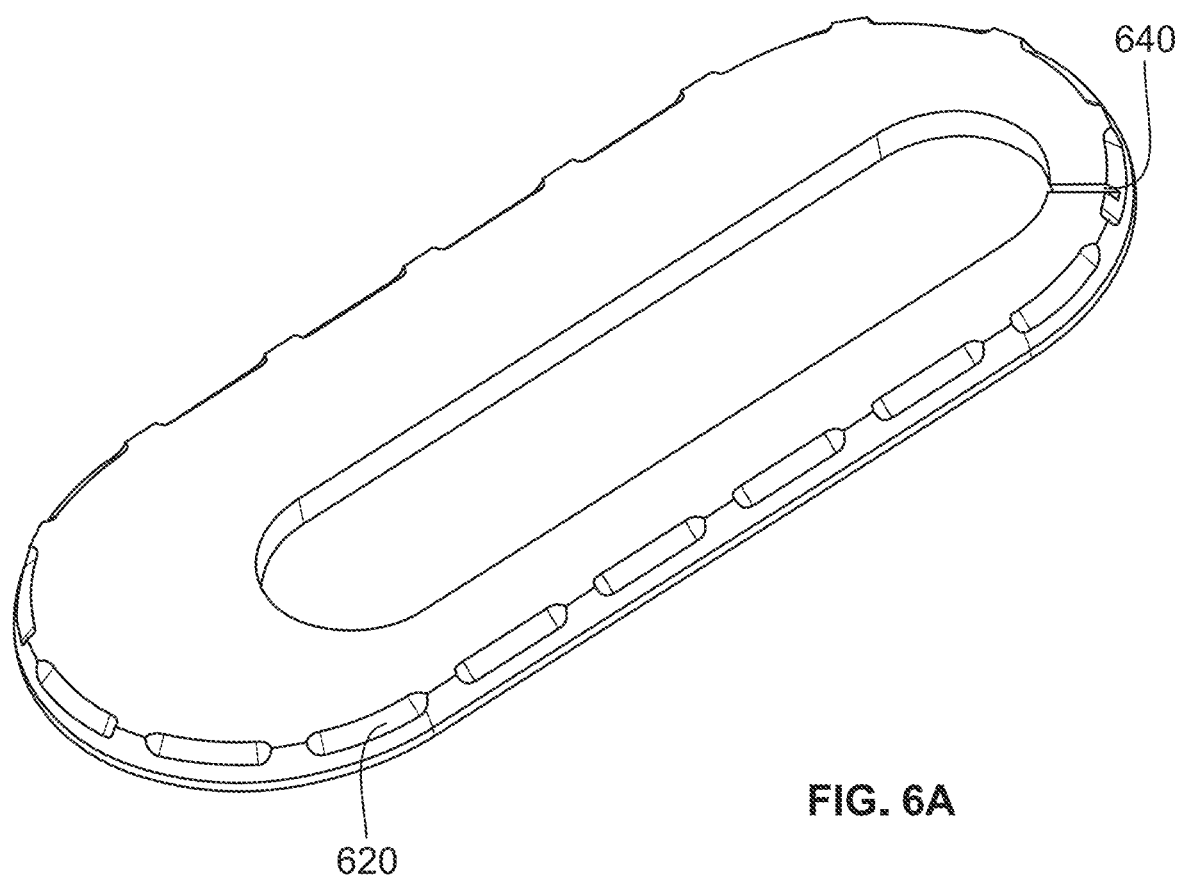
FIGS. 6A-E illustrate various views of the crucible cover.
Figure 6B:
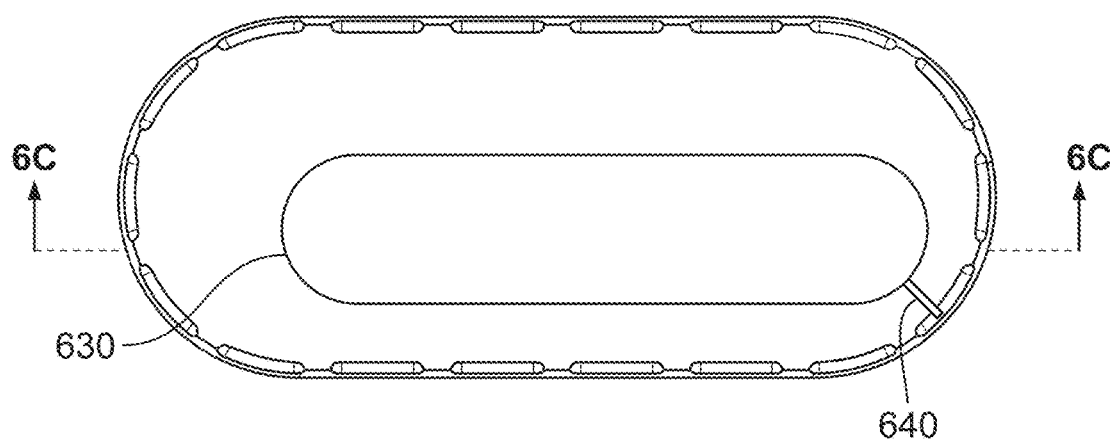

FIGS. 6A-E illustrates a crucible cover system 600 that keeps the heat contained within each crucible during the melting process. FIG. 6A is bottom isometric view that shows a pattern of notched sections 620, that enable a press-fit around 140 of each cavity 126A and 126B. FIG. 6B shows a bottom view, with opening 630, which is used to feed alumina pellets through. A channel 640 extends from 630 to the outer edge. This channel 640 is designed to wick the liquid sapphire away from the central hole towards the wall of the pocket or cavity, where it can run down. This keeps liquid sapphire from accumulating on the underside of the crucible pocket cover. Without the slot, a large fillet of liquid sapphire can form around the base of the tungsten feed tube.

One purpose of the cover is to contain the heat, while allow alumina pellets to feed into each cavity of the crucibles. It should also be noted that the opening 630 within crucible cover system 600 is offset to one side and not centered. This is done so that when the feeding tube 700 sets thereon it is also offset and doesn't impede a view of the sapphire sheet being drawn upward so that a person can visually inspect the crystal-sapphire sheet along the 110 channel to make sure that no bubbling or bulging occurs as the sheet is being created. Any abnormalities detected can be used to facilitate a change in height of the heat plugs 300 as part of the heat controlling features of the assembly 1100 to make sure that appropriate amount of heat is being distributed effectively for quality production. In summary, the offset crucibles, openings, feeding tubes, are all intentional to make sure this line of sight down is not impeded and accessible.

Figure 6C:
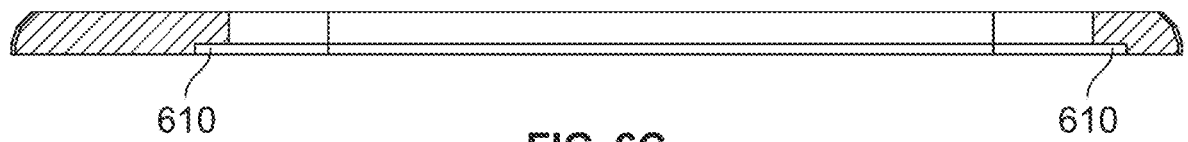
Figure 6D:
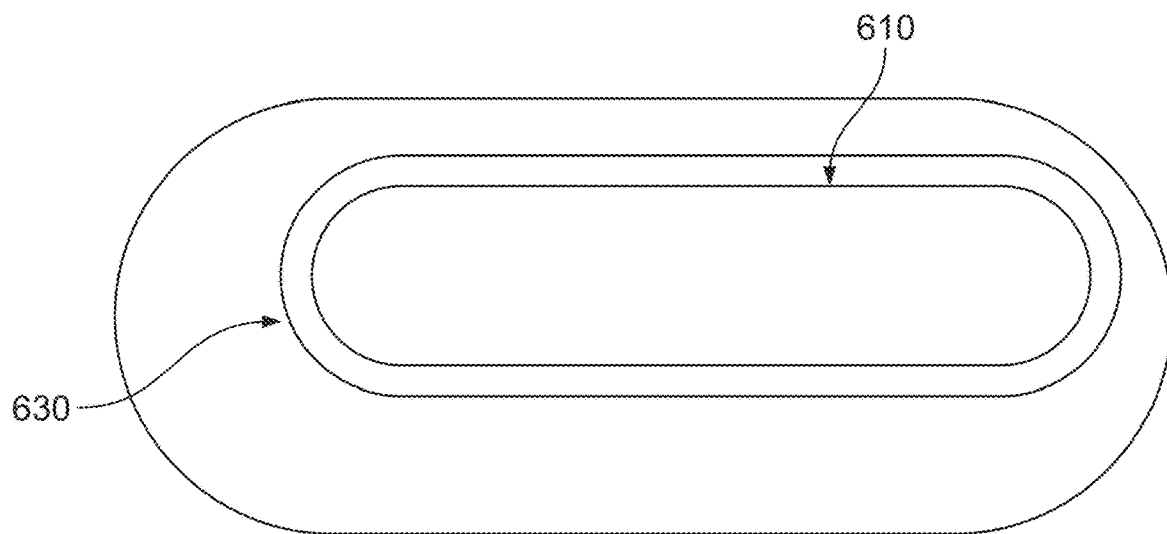
Figure 6E:
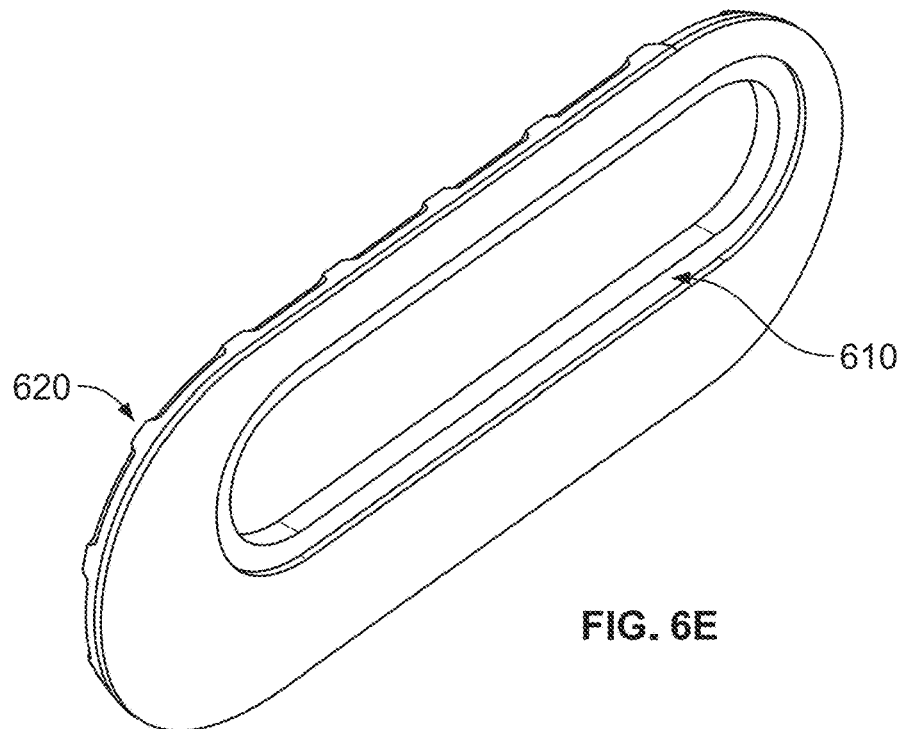
Figure 7A:
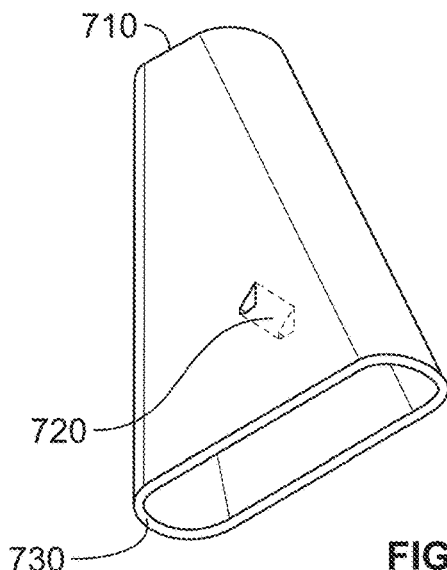
FIGS. 7A-H illustrate various view of Tungsten feed tube.
Figure 7B:
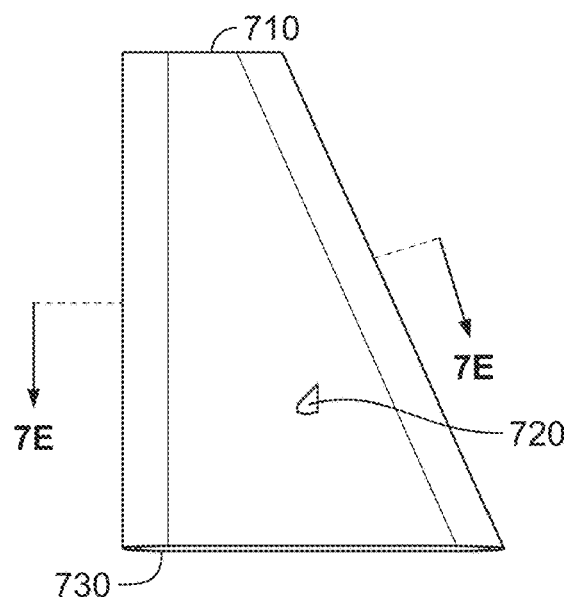
Figure 7C:
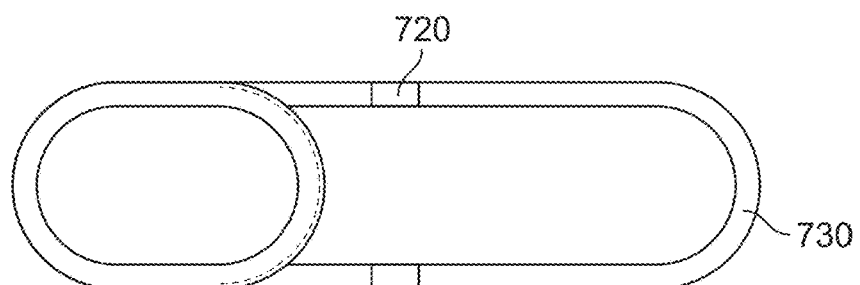
Figure 7D:
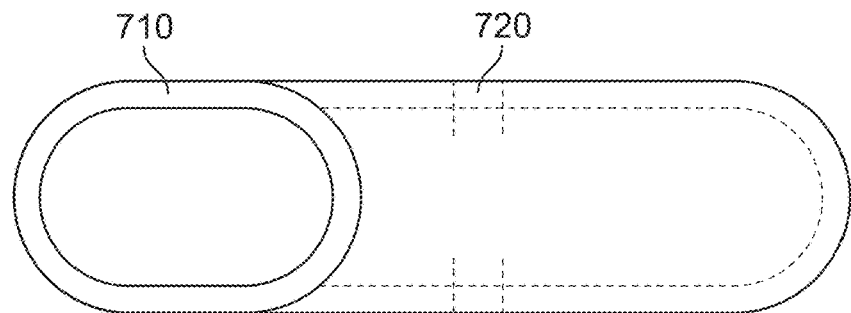
Figure 7E:
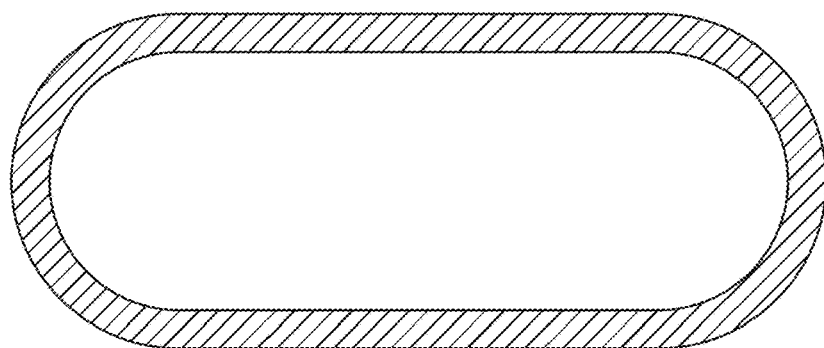
Figure 7F:
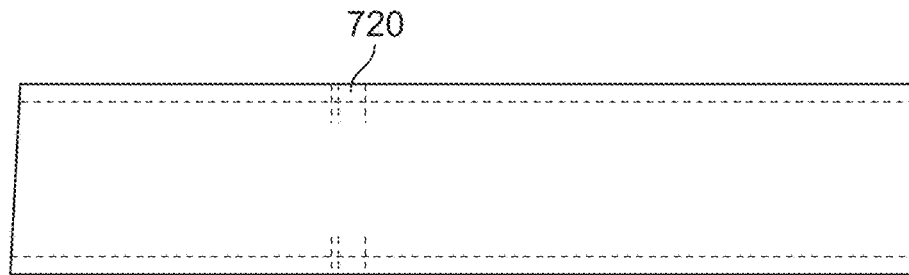
Figure 7G:
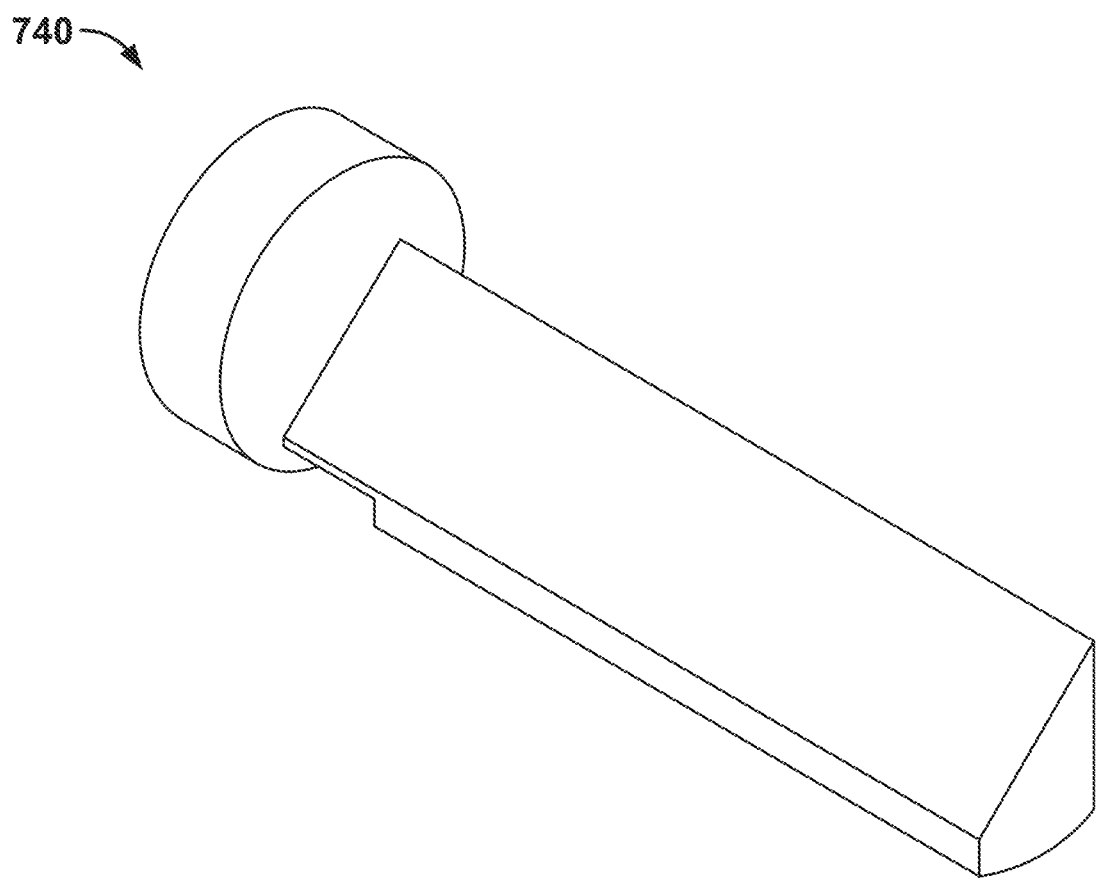
Figure 7H:
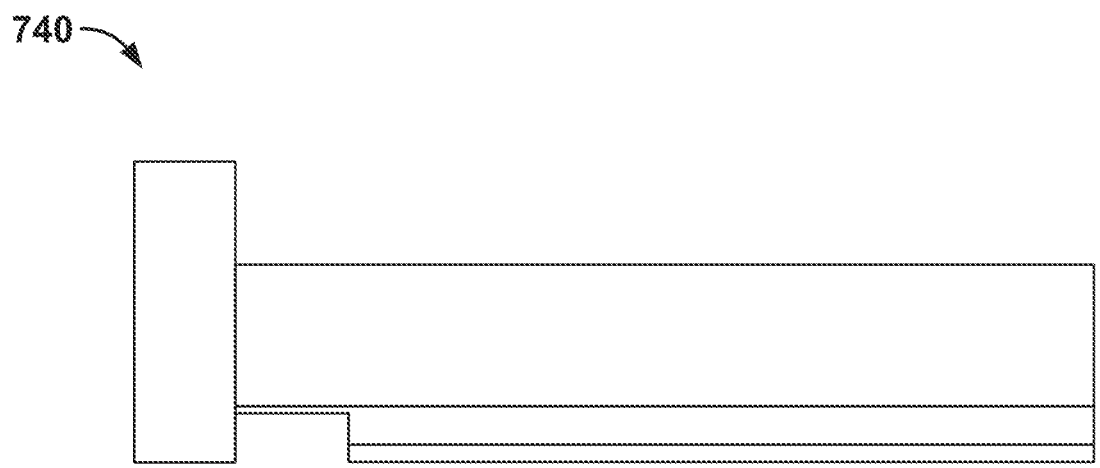

FIG. 6C is a cross-section of the cover, 610 is a lip contained within the 630 opening that will connect with the Tungsten feed tube system 700 that will allow for a continuous stream of material to be feed into the crucible/die system 10. FIG. 6D is a top-down view of the cover showing the lip 610 where the feed tube will rest. FIG. 6E shows a 3D view of the cover with the lip 610, protrusions 620, and how opening 630 is offset.

FIGS. 7A-H illustrate various views of a feeding tube 700 with the triangular scatter pin 740. The feeding tube 700 can also be made from tungsten or molybdenum, so as to withstand the heat and not melt or warp. A smaller aperture 710 at the top of 700 can be connected to another tube, not shown, which feed material into 700. The feeding tube widens as the material passes from aperture 710 to the larger aperture 730 where it exits through the tube 700, through the opening 630 and into the cavities 126A-B of the crucibles 120A-B. One of the purposes of the widening of the feeding tube is to cause the pellets to scatter. A triangular scattering pin 720 is also present across the interior cavity of 700 to also help scatter the pellets. By trying to more evenly scatter the pellets, it ensures the pellets melt more uniformly and reduces in pockets of pellet build-up, which could effect the heat profile and needs of the system. Uniform and consistent melting is desired, especially when drawing out the single-crystal sapphire sheet. This also enables a faster draw as a result.

Figure 8C:
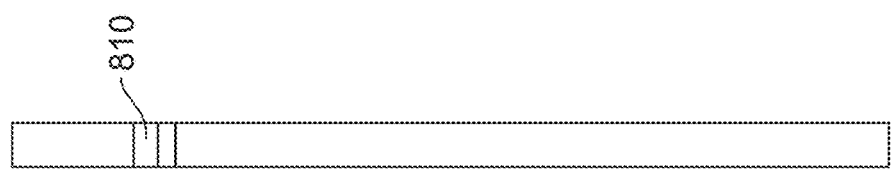
FIGS. 8A-C illustrate various views of the seed.
Figure 8B:
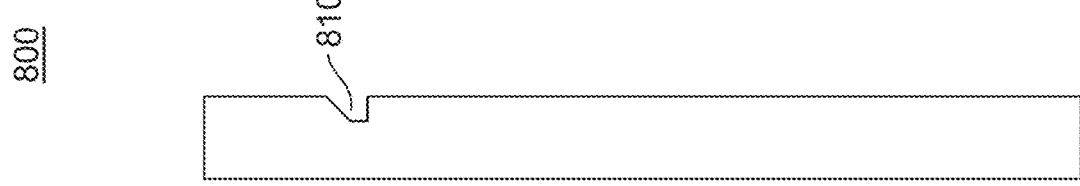
Figure 8A:
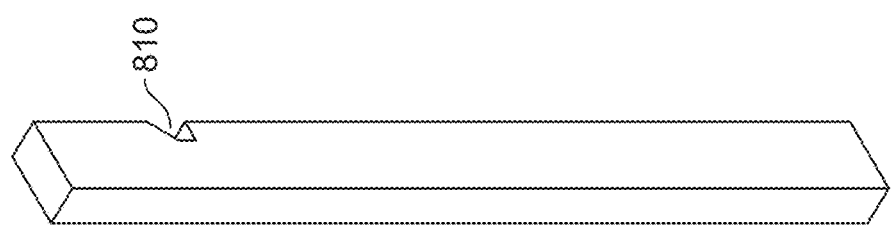
Figure 9A:
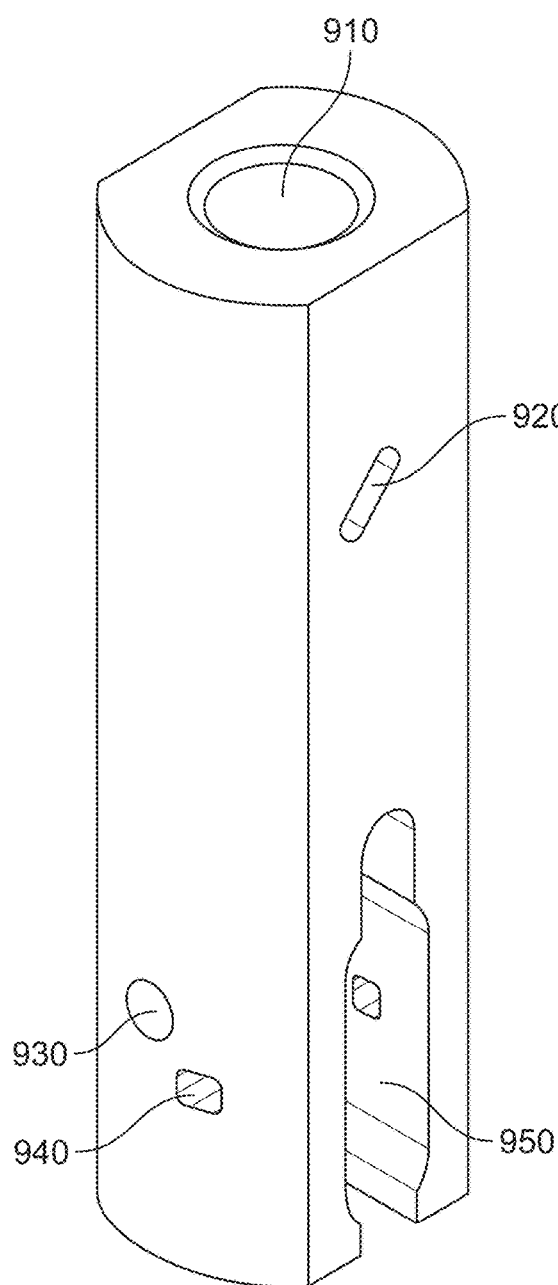
FIGS. 9A-F illustrate various views of the seed holder.
Figure 9B:
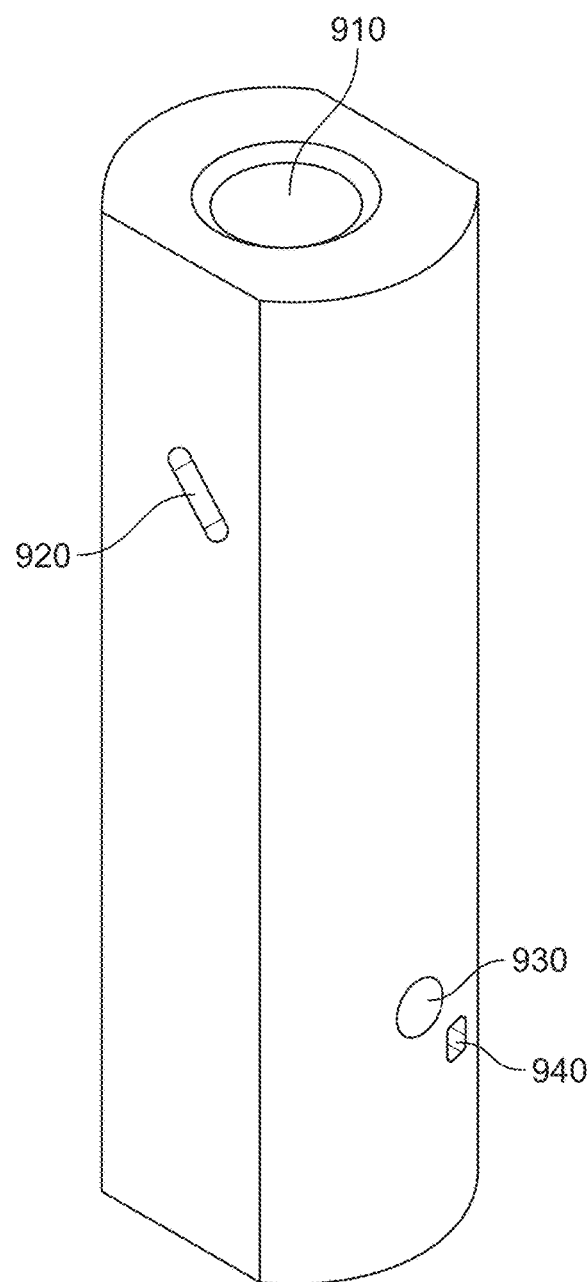
Figure 9C:
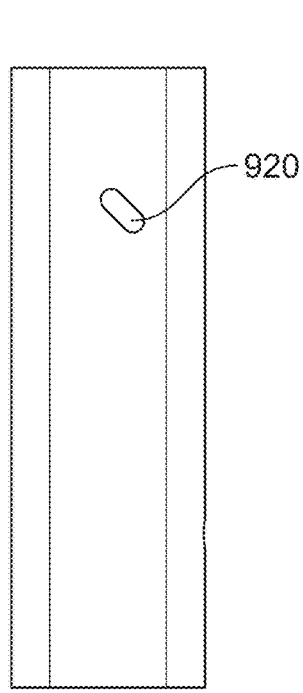
Figure 9D:
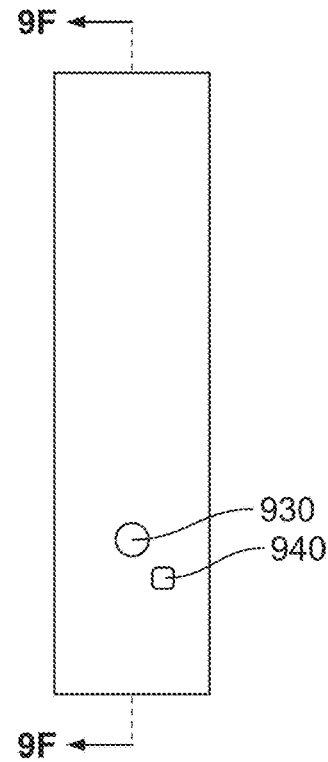
Figure 9E:
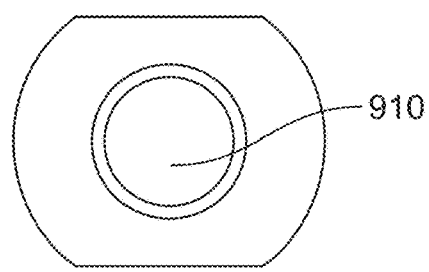
Figure 9F:
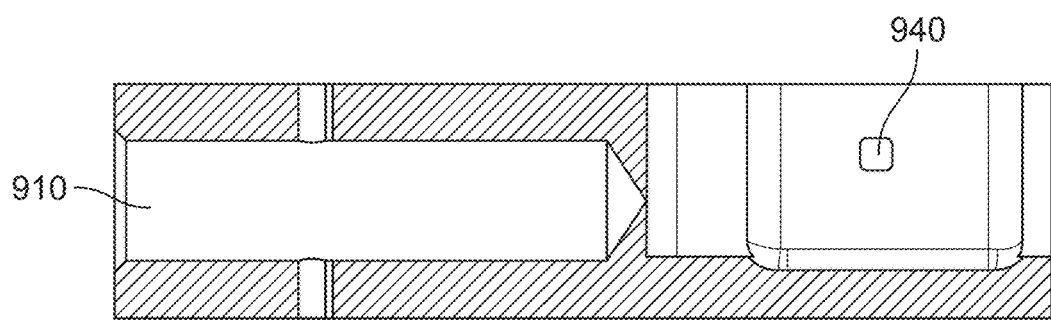

In order to create a crystal-sapphire sheet there needs to be a seed placed within the 110 channel near the midpoint of the channel where the peak 112 is formed. This seed is a cut single-crystal sapphire piece 800. As it is dipped into the melt, a well-known reaction occurs where the single-crystal bonding begins with the piece 800 and it can be drawn out until it comes to the edges of crystal shaper of the die, which forms the full width of the sheet, as noted above. FIGS. 8A-C illustrate what a seed looks like. 810 is a notch or hook cut within the piece of seed material 8000 that attaches to seed holder system 900.

A seed holder 900 holds the piece 800 as it dipped into channel 110, and draws the material upward. FIGS. 9A-F illustrate various views and the workings of a seed holder. 910 is an opening where a rod is inserted into the top, at which point the seed 800 is attached to the seed holder 900 via opening 950.

920 secures the seed holder to the seed shaft. A pin goes through both slots of 920. Slot 920 is angled so the weight of the seed holder and crystal-sapphire sheet pushes the seed holder to one side of hole 910. The seed's shaft two "feet" opposite the hole keeps the seed holder from rocking against the tip of the shaft. This enables the seed holder to be supported by the seed shaft without any relative motion between them.

930 is a threaded hole for a Tungsten screw. The screw pushes the flat face of seed 800 to one side of the slot to prevent wobbling. Hole 940 is where a pin goes through this hole, and notch 810 of the seed. The sloped portion of notch 810 rests against the pin. The slope causes the seed to push back against the wall of the seed holder. The seed rests against the two flats at the top and bottom, keeping it from rocking. Hole 940 is rectangular so the pin rests in a corner, giving positive positioning with no play, locking the seed 800 into place. The seed is then lowered into 100 via channel 110, and comes into contact with melted material, and then the seed holder is raised up, and then starts drawing out material from the die via the seed.

FIG. 10 is a heat shield 1000 that is designed to cover the top portion of the crucible/die system 10, with an opening 1010 to allow the formed sheet to be drawn through. The heat shield 1000 is designed to nestle within the heating element 500 via several notches and protrusions. The notches 550 in the heat element align with the protrusions of 1020. The purpose of the heat shield is to keep as much heat contained within the heating element and the crucible/die, thus eliminating additional energies to keep material at a constant melting temperature. Additional insulation can be placed around the sheet of single-crystal sapphire being drawn, but is not shown. It is known in the art to keep the sheet insulated and control the cooling process.

Figure 11A:
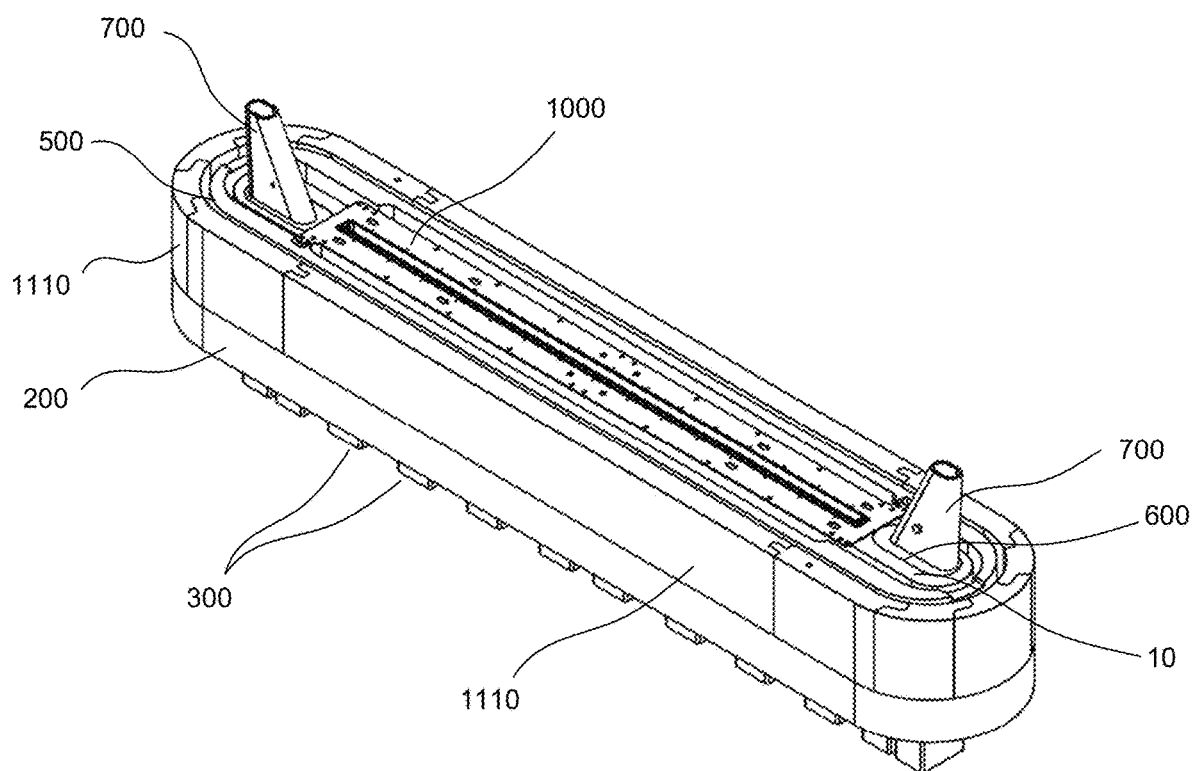
FIGS. 11A-C illustrate assembly views of an integrated die and crucible assembly.
Figure 11B:
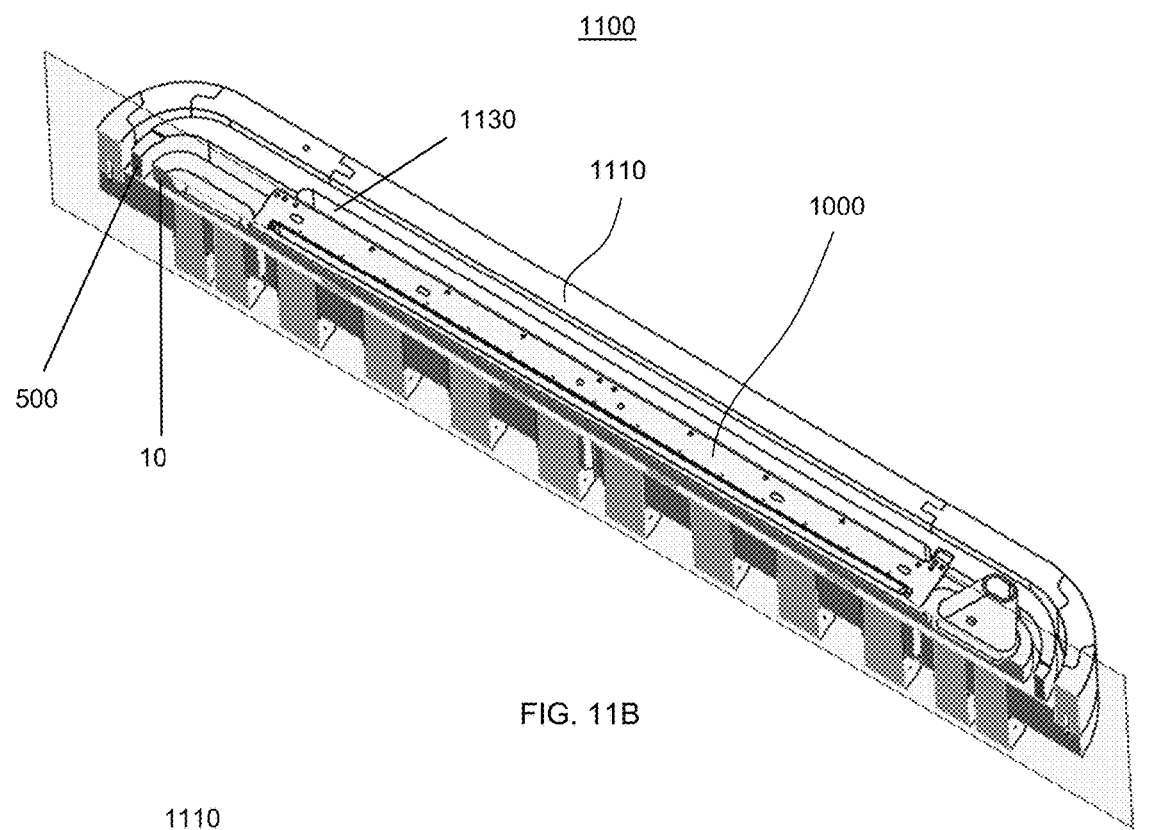
Figure 11C:
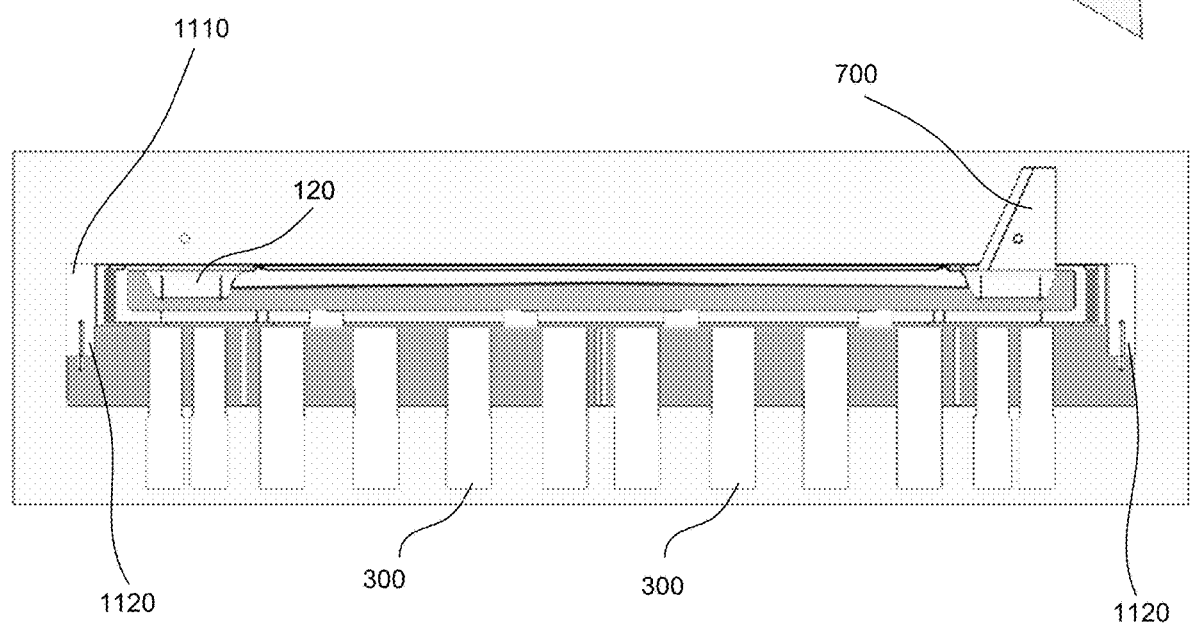

FIGS. 11A-B illustrate an integrated die and crucible assembly 1100. FIG. 11A is a perspective of the assembly 1100, showing the integrated crucible and die system 10, crucible covers 600, feed tubes 700 on the covers 600, heater 500 surrounding system 10, base insulation module 200, with heat plugs 300 and a sidewall insulation module 1110 that rests on 200 and surrounds the heater and system 10. Also shown is the heat shield 1000 on over system 10. FIGS. 11B-C are various cross-sectional views of 1100 to further show how each system and component is arranged in assembly 1100.

As stated throughout this summary and detailed description there are several advantages of the systems, assembly and methods described above. These include the ability to use less power, because of a system that is smaller in size and has various heat control features. The ability to tune the growth of the single-crystal sapphire sheet, because of the heat control mechanisms. The cost savings associated with an integrated crucible and die system. The ability to grow wider sheets of single-crystal sapphire consistently, because of the controls and particular setup of the systems and assembly. These and other advantages will be apparent to those skilled in the art and are substantial improvements over the current state of the art.

Of course, the present invention is not limited to the above features and advantages. Those of ordinary skill in the art will recognize additional features and advantages upon reading this detailed description, and upon viewing the accompanying drawings.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. An integrated crucible and die system for creating a single-crystal sapphire sheet, comprising:
   a body portion having a channel across the length of the body portion and a crystal shaper disposed about a portion of the channel and extending from the body portion;
   a first crucible disposed on a first end of the body portion, wherein the channel extends into the first crucible; and a second crucible disposed on a second end of the body portion, wherein the channel extends into the second crucible, wherein the first crucible, the second crucible and the body portion form an integrated system, and wherein each crucible is in fluid communication with the channel and crystal shaper.

2. The integrated crucible and die system for creating the single-crystal sapphire of claim 1, wherein the channel slopes upward from the first crucible and upward from the second crucible to form a peak about a center portion of the channel.

3. The integrated crucible and die system for creating single crystal sapphire of claim 1, wherein the body portion is formed of tungsten or molybdenum.

4. The integrated crucible and die system for creating the single-crystal sapphire of claim 1, wherein the first crucible is formed at an offset to the channel.

5. The integrated crucible and die system for creating the single-crystal sapphire of claim 4, wherein the second crucible is formed at an offset to the channel.

6. The integrated crucible and die system for creating the single-crystal sapphire of claim 5, wherein the offset of the first crucible mirrors the offset of the second crucible about an axis that coincides with the channel.

7. The integrated crucible and die system for creating the single-crystal sapphire of claim 1, wherein a portion of wall thickness from an outer edge of each of a cavity portion of the first and second crucibles has a dimension that is less than a wall thickness from either edge of the channel to an outer surface of the body portion.

8. The integrated crucible and die system for creating the single-crystal sapphire of claim 1, further comprising a heater disposed about a perimeter of the integrated system, and wherein the interior of the heater corresponds in shape to the perimeter of the integrated system.

9. The integrated crucible and die system for creating the single-crystal sapphire of claim 8, wherein the heater has a first end portion and a second end portion, with a central portion disposed therebetween, and wherein the central portion is configured to produce heat output that is greater than either end portions.

10. The integrated crucible and die system for creating the single-crystal sapphire of claim 8, wherein the heater has a first end portion and a second end portion, with a central portion disposed therebetween, and wherein the central portion has a wall thickness that is less than a wall thickness about either end portions.

11. The integrated crucible and die system for creating the single-crystal sapphire of claim 1, further comprising:
a first cover having an opening that is disposed over a cavity portion of the first crucible;
a second cover having an opening that is disposed over a cavity portion of the second crucible;
a first angled feed tube having a first aperture and a second aperture, wherein the second aperture is larger than the first aperture, the second aperture is shaped and sized to fit over the opening of the first cover; and
a second angled feed tube having a first aperture and a second aperture, wherein the second aperture is larger than the first aperture, the second aperture is shaped and sized to fit over the opening of the second cover.

12. The integrated crucible and die system for creating the single-crystal sapphire of claim 11, wherein each of the first and second angled feed tubes has a scatter pin disposed across an interior cavity portion of each of the angled feed tubes and is configured to cause material entering the first aperture of each to scatter about prior to leaving the second aperture into respective crucibles.

13. A system for creating a single-crystal sapphire sheet, comprising:
an integrated crucible and die comprising:
a body portion having a channel across the length of the body portion and a crystal shaper disposed about a portion of the channel and extending from the body portion;
a first crucible disposed on a first end of the body portion, wherein the channel extends into the first crucible, and
a second crucible disposed on a second end of the body portion, wherein the channel extends into the second crucible,
wherein the first crucible, the second crucible and the body portion form an integrated system, and
wherein each crucible is in fluid communication with the channel and crystal shaper; and
a heater having an interior cavity disposed about the integrated crucible and die, wherein the interior cavity has a shape that corresponds in shape to the perimeter of the integrated crucible and die.

14. The system for creating a single-crystal sapphire sheet of claim 13, wherein a uniform gap exists between the interior cavity of the heater and the perimeter of the integrated crucible and die.

15. The system for creating a single-crystal sapphire sheet of claim 13, further comprising:
a first cover having an opening that is disposed over a cavity portion of the first crucible;
a second cover having an opening that is disposed over a cavity portion of the second crucible;
a first angled feed tube having a first aperture and a second aperture, wherein the second aperture is larger than the first aperture, the second aperture is shaped and sized to fit over the opening of the first cover; and
a second angled feed tube having a first aperture and a second aperture, wherein the second aperture is larger than the first aperture, the second aperture is shaped and sized to fit over the opening of the second cover.

16. A method for producing a single-crystal sapphire comprising the steps of:
feeding Alumina pellets through first and second angled feeding tubes to a first crucible and a second crucible, wherein the first crucible and second crucible have an integrated die disposed between each crucible, and wherein the integrated die includes a channel that is in fluid communication with both crucibles;
melting the Alumina pellets at a first heat output using a heater disposed about the first crucible, second crucible and integrated die;
feeding melted Alumina from each crucible into the integrated die through the channel;
heating the integrated die with a second heat output using the heater disposed about the first crucible, second crucible and integrated die;
depositing a seed for A or C-plane growth into a center portion of the integrated die;
drawing out the seed using a seed holder while continuing to melt Alumina into each crucible and feeding the melted Alumina into the channel of the integrated die where it can begin to form a single-crystal sapphire.

17. The method for producing a single-crystal sapphire of claim 16, further comprising the step of:
scattering the Alumina entering the first and second angled feeding tubes using a scatter pin disposed across the length of an interior cavity of each of the angled feeding tubes, such that Alumina pellets deposit into the first crucible and the second crucible at varying locations, whereby a more uniform melting process can occur.

18. The method for producing a single-crystal sapphire of claim 16, wherein the first heat output is less than the second heat output.

19. The method for producing a single-crystal sapphire of claim 16, wherein the first heat output is generated by a portion of the heater having a wall thickness that is greater than a portion of wall thickness of the heater that generates the second heat output.

* * * * *